United States Patent
Bollu et al.

(10) Patent No.: US 7,184,291 B2
(45) Date of Patent: Feb. 27, 2007

(54) SEMICONDUCTOR MEMORY HAVING CHARGE TRAPPING MEMORY CELLS AND FABRICATION METHOD

(75) Inventors: Michael Bollu, München (DE); Armin Kohlhase, Neubiberg (DE); Christoph Ludwig, Langebrück (DE); Herbert Palm, Hühenkirchen (DE); Josef Willer, Riemerling (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 83 days.

(21) Appl. No.: 11/145,541

(22) Filed: Jun. 3, 2005

(65) Prior Publication Data

US 2005/0286296 A1    Dec. 29, 2005

Related U.S. Application Data

(63) Continuation of application No. PCT/EP03/14172, filed on Dec. 12, 2003.

(30) Foreign Application Priority Data

Dec. 12, 2002    (DE)    ............................ 102 58 194

(51) Int. Cl.
    *G11C 5/06*    (2006.01)
(52) U.S. Cl. .................... 365/63; 365/185.01; 365/190
(58) Field of Classification Search ................ 365/63, 365/185.01, 190
    See application file for complete search history.

(56) References Cited

U.S. PATENT DOCUMENTS

| 5,168,334 A | 12/1992 | Mitchell et al. |
| 5,349,221 A | 9/1994 | Shimoji |
| 5,679,591 A | 10/1997 | Lin et al. |
| 5,760,437 A | 6/1998 | Shimoji |
| 5,768,192 A | 6/1998 | Eitan |
| 5,787,035 A | 7/1998 | Kang et al. |
| 6,011,725 A | 1/2000 | Eitan |
| 6,211,019 B1 | 4/2001 | Klose et al. |

(Continued)

FOREIGN PATENT DOCUMENTS

DE    101 17 037 A1    10/2002

(Continued)

OTHER PUBLICATIONS

Willer, J., et al., "Novel Virtual Ground Array with Shallow Trench Isolation NROM Architecture." date unknown, 3 pages.

(Continued)

*Primary Examiner*—Anh Phung
*Assistant Examiner*—Pho M. Luu
(74) *Attorney, Agent, or Firm*—Slater & Matsil, L.L.P.

(57) ABSTRACT

In the case of this semiconductor memory having NROM cells, the channel regions of the memory transistors in each case run transversely with respect to the relevant word line, the bit lines are arranged on the top side of the word lines and in a manner electrically insulated from the latter, and electrically conductive cross-connections are present, which are arranged in sections in interspaces between the word lines and in a manner electrically insulated from the latter and are connected to the bit lines in each case in next but one sequence.

20 Claims, 7 Drawing Sheets

U.S. PATENT DOCUMENTS

| | | |
|---|---|---|
| 6,215,148 B1 * | 4/2001 | Eitan .................... 257/316 |
| 6,239,500 B1 | 5/2001 | Sugimachi |
| 6,348,711 B1 | 2/2002 | Eitan |
| 6,469,935 B2 | 10/2002 | Hayashi |
| 6,477,084 B1 | 11/2002 | Eitan |
| 6,664,588 B2 | 12/2003 | Eitan |
| 2002/0008993 A1 | 1/2002 | Hayashi |
| 2002/0132430 A1 | 9/2002 | Willer et al. |
| 2004/0079986 A1 | 4/2004 | Kakoschke et al. |
| 2006/0192266 A1 * | 8/2006 | Willer et al. ............ 257/510 |

FOREIGN PATENT DOCUMENTS

WO   WO 99/60631   11/1999

OTHER PUBLICATIONS

Ogura, T., et al., "Embedded Twin MONOS Flash Memories with 4ns and 15ns Fast Access Times," 2003 Symposium on VLSI Circuits Digest of Technical Papers, Jun. 2003, 4 pages.

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

US 7,184,291 B2

SEMICONDUCTOR MEMORY HAVING CHARGE TRAPPING MEMORY CELLS AND FABRICATION METHOD

This application is a continuation of International Application No. PCT/EP2003/014172, filed Dec. 12, 2003, which designated the United States and was published in English, and which is based on German Application No. 102 58 194.0, filed Dec. 12, 2002, both of which applications are incorporated herein by reference.

TECHNICAL FIELD

The present invention relates generally to semiconductor devices and methods, and more particularly to a semiconductor memory having charge-trapping memory cells and fabrication method.

BACKGROUND

Memory cell arrays comprising charge-trapping memory cells having memory transistors that can be programmed by channel hot electrons (CHE) and can be erased by hot holes, for example, in particular comprising planar SONOS memory cells or NROM memory cells (U.S. Pat. No. 5,768,192, U.S. Pat. No. 6,011,725 and International Patent No. WO 99/60631) having planar MOS transistors and an oxide-nitride-oxide storage layer sequence as gate dielectric require voltages of 4 to 5 volts for programming and erasing, which may be regarded as a disadvantage. Moreover, the memory cells can only be miniaturized more extensively if they are not arranged in one plane one beside the other but rather at the walls of trenches, which are etched out at the top side of a semiconductor body.

A multiplicity of such trenches run at a distance from and parallel to one another and thus form a kind of comb structure at the surface of the semiconductor body. The channels of the memory transistors are arranged vertically at the trench walls. The source and drain regions are arranged at the top side of the semiconductor body in a manner adjoining the trenches and in the trench bottoms. The source/drain regions are connected to bit lines. The gate electrodes of the memory transistors are arranged in the trenches and are connected to word lines arranged transversely with respect to the bit lines on the top side of the memory cell array.

The gate dielectric is formed at the walls of the trenches by a storage layer sequence for which an oxide-nitride-oxide layer sequence is customarily used. In this case, the nitride layer is provided as the actual storage layer in which, during the programming of the cell, electrons are trapped between the boundary layers made of oxide (trapping).

A virtual ground array comprising NROM cells is customarily connected to word lines that run above the source/drain regions and cross with buried bit lines. The transistor current, therefore, flows parallel to the word lines.

This results in various difficulties. The memory transistors cannot be optimized by a more precise setting of the source/drain dopings (LDD, pocket implantation). The word lines have a small cross section, so that fast access to the memory contents is not possible owing to the low electrical conductivity caused as a result of the small cross section. Since the isolation between adjacent channel regions is preferably effected by a channel stop implantation, dopants diffusing into the channel region can bring about a non-uniform current distribution in the channel together with a significant occurrence of the narrow width effect.

U.S. Pat. No. 6,469,935 B2 describes an array architecture nonvolatile memory and its operation methods. In this array, there are a plurality of first connection regions connecting together a first cluster of four memory cells within a square and comprising source/drain regions of the cell transistors, and a plurality of second connection regions connecting together a second cluster of four memory cells within a square and comprising source/drain regions of the cell transistors, each pair of first and second clusters comprising one cell in common. The operation method makes use of control gates connected to control lines that run in parallel with the word lines and are arranged on both sides adjacent to the word lines.

U.S. Pat. No. 5,679,591 describes a method for fabricating a contactless semiconductor memory with bit lines on the top side, in the case of which bit line strips are in each case arranged between the word line stacks and interconnect the source/drain regions of the successive memory transistors along the word lines. The channel regions are oriented transversely with respect to the word lines and are mutually isolated from one another by trench isolations.

SUMMARY OF THE INVENTION

It is an object of the present invention to specify an improved semiconductor memory having charge trapping memory cells in a virtual ground architecture.

This object is achieved by means of the semiconductor memory having the features described herein and by means of the method for fabricating such a memory having the features described herein. Refinements of these embodiments are also envisioned.

In the case of this semiconductor memory having charge-trapping memory cells, in particular SONOS cells or NROM cells, the channel regions in each case run transversely with respect to the relevant word line, the bit lines are arranged on the top side of the word lines and in a manner electrically insulated from the latter, and electrically conductive cross-connections are present, which are arranged as conductive jumper connections in sections in interspaces between the word lines and in a manner electrically insulated from the latter and are connected to the bit lines in a specific manner.

In accordance with a consecutive numbering of the memory transistors along a respective word line, the cross-connections electrically conductively connect, on one side of the word line, in each case a source/drain region of an even-numbered memory transistor to a source/drain region of the subsequent odd-numbered memory transistor in the numbering and, on the opposite side of this word line, in each case a source/drain region of an odd-numbered memory transistor to a source/drain region of the subsequent even-numbered memory transistor in the numbering. The word lines can be contact-connected between the bit lines with word line straps that reduce the electrical bulk resistance.

Examples of the semiconductor memory and of the fabrication method are described in more detail below with reference to the accompanying FIGS. 1 to 14.

BRIEF DESCRIPTION OF THE DRAWINGS

For a more complete understanding of the present invention, and the advantages thereof, reference is now made to the following descriptions taken in conjunction with the accompanying drawing, in which.

Figure 1:
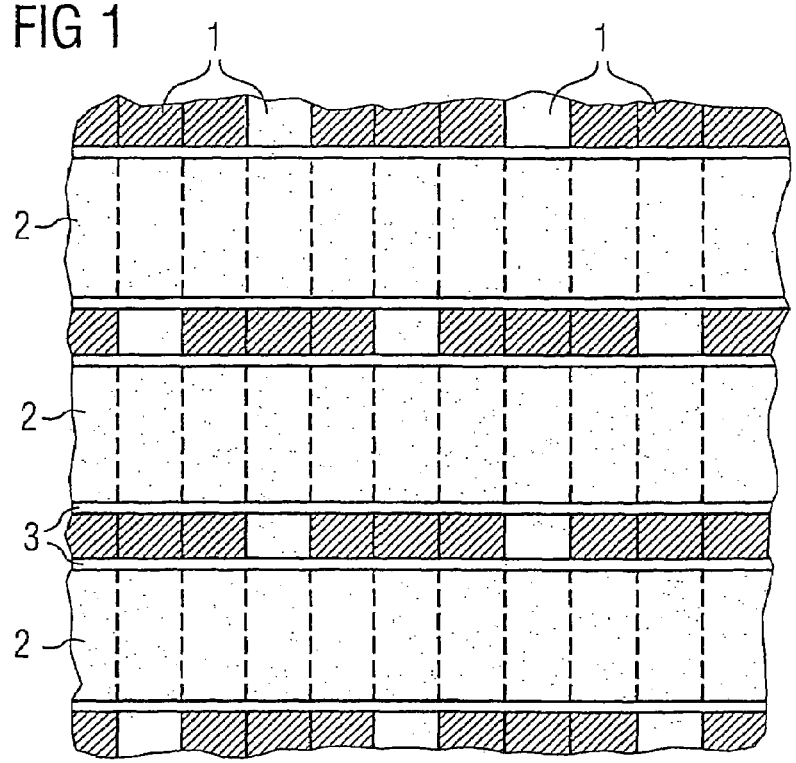
FIG. 1 shows an arrangement scheme of the STI isolations and word lines.

The following list of reference symbols can be used in conjunction with the figures:
1 STI isolation
2 Word line
3 Spacer
4 Bit line
5 Bit line contact
6 Word line strap
7 Pad oxide
8 Pad nitride
9 Well
10 First boundary layer
11 Storage layer
12 Second boundary layer
13 First word line layer
14 Second word line layer
15 Hard mask
16 Doped region
17 Channel region
18 Spacer
18a Oxide layer
19 Source/drain region
20 Word line web
21 Cross-connection
22 Dielectric filling
23 Contact hole filling
24 Dielectric layer
24a Further dielectric layer
25 Further dielectric layer
26 Nitride liner
27 Dielectric filling
28 Opening

DETAILED DESCRIPTION OF ILLUSTRATIVE EMBODIMENTS

FIG. 1 shows a plan view of a scheme revealing the positions of the STI isolations 1, word lines 2 with lateral spacers 3 and the regions that are to be electrically conductively connected to one another. The STI isolations (shallow trench isolation) are isolation trenches that are arranged parallel at a distance from one another and between which there are in each case channel regions of the transistors that run parallel to the isolation trenches below each word line 2. The word lines, therefore, run over the channel regions arranged transversely with respect to the longitudinal direction of the word line. The source/drain regions of the transistors are in each case present in a manner laterally adjoining the word lines. The source/drain regions are electrically conductively connected to one another in the regions that are in each case identified in hatched fashion in FIG. 1, a short piece of the relevant isolation trench being bridged in each case.

Figure 2:
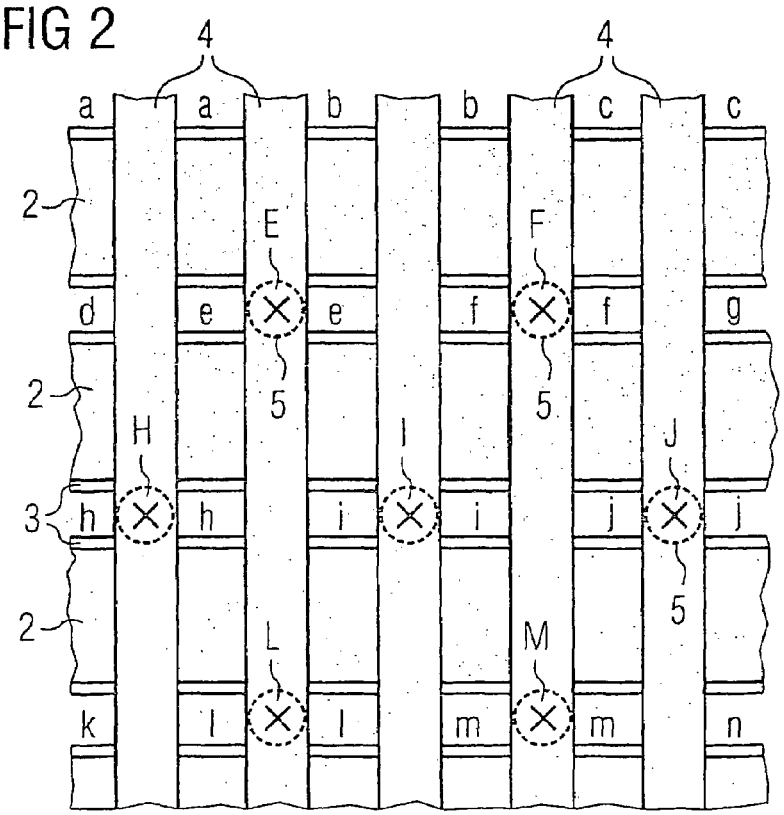
FIG. 2 shows an arrangement scheme of the word lines and bit lines.

FIG. 2 illustrates a plan view of this arrangement including the bit lines 4 applied above the word lines 2. The regions depicted in hatched fashion in FIG. 1, designated as cross-connections hereinafter, are in each case designated by the same lower-case letters in FIG. 2. The cross-connections are contact-connected by the bit lines 4. The bit line contacts 5 are depicted by broken lines as concealed contours in FIG. 2 and identified by a cross. Furthermore, the bit line contacts 5 are in each case designated by that upper-case letter that corresponds to the lower-case letter of the relevant cross-connection. It can be seen in FIG. 2 that the bit lines 4 are in each case electrically contact-connected at cross-connections that are arranged successively in the direction of the bit lines in each case in next but one interspaces between the word lines 2.

Figure 3:
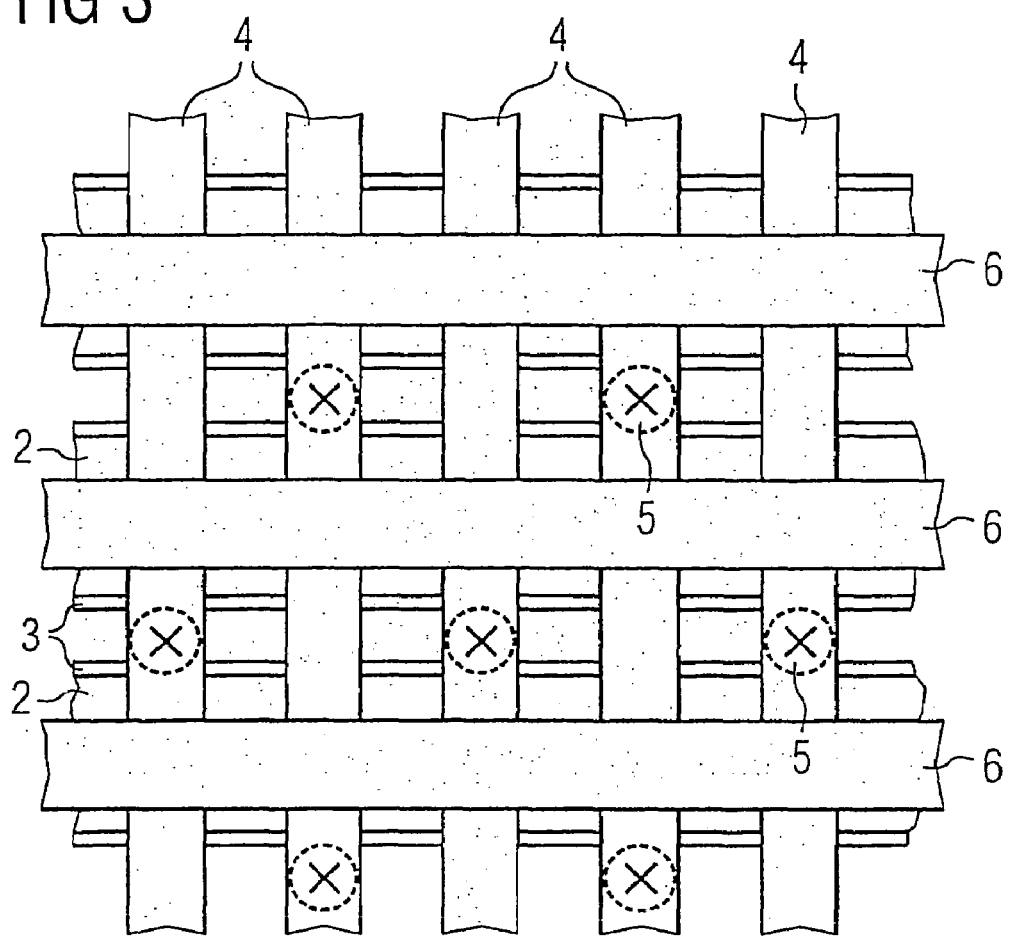
FIG. 3 shows an arrangement scheme of the word lines, bit lines and word line straps.

FIG. 3 shows the plan view in accordance with FIG. 2 with word line straps 6 that are contact-connected on the top side of the word lines 2 and are arranged above the bit lines 4. The word line straps 6 serve for further reducing the electrical bulk resistance of the word lines. The bit lines 4 are electrically insulated both from the word lines 2 and from the word line straps 6.

Figure 4:
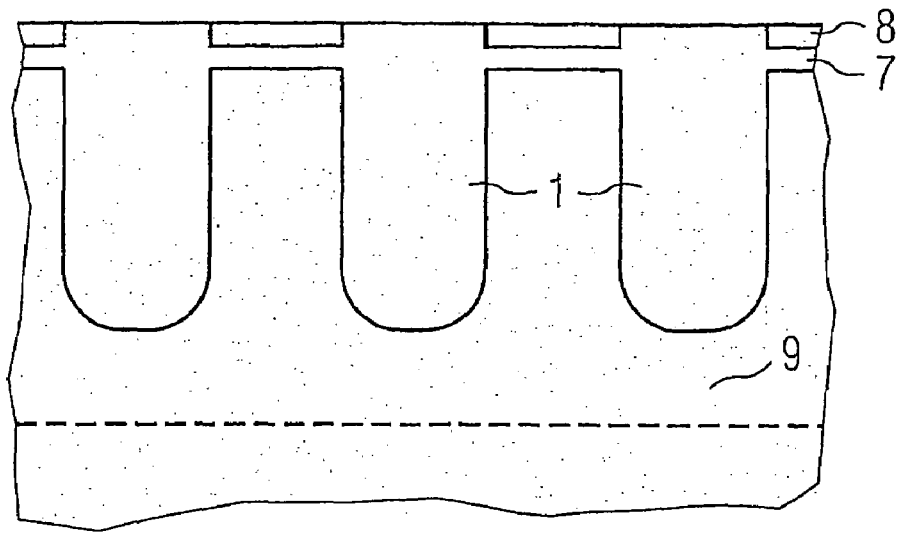
FIG. 4 shows a detail from a first intermediate product of a fabrication method in a cross section along the word lines.

The more precise structure of this exemplary embodiment of the semiconductor memory will be explained with reference to a preferred fabrication method and the further figures. FIG. 4 shows a detail from an intermediate product of the semiconductor memory in cross section parallel to the word lines to be fabricated. The customary layers comprising pad oxide 7 and pad nitride 8 are fabricated on a top side of a semiconductor body or substrate. The semiconductor material has a concentration of dopant that suffices for forming channel regions of memory transistors. For this purpose, it is possible to form doped wells in a substrate in the manner that is known per se from the fabrication of transistors. A doped well 9 provided for the channel regions of the transistors is indicated by the well interface depicted by a broken line in FIG. 4.

The isolation trenches are fabricated as STI isolations 1 at the top side of the semiconductor body or substrate. These STI isolations 1 are constituted by a multiplicity of isolation trenches that are arranged parallel at a distance from one another and are preferably filled with an oxide of the semiconductor material. However, there may also be a different dielectric in the isolation trenches.

Figure 5:
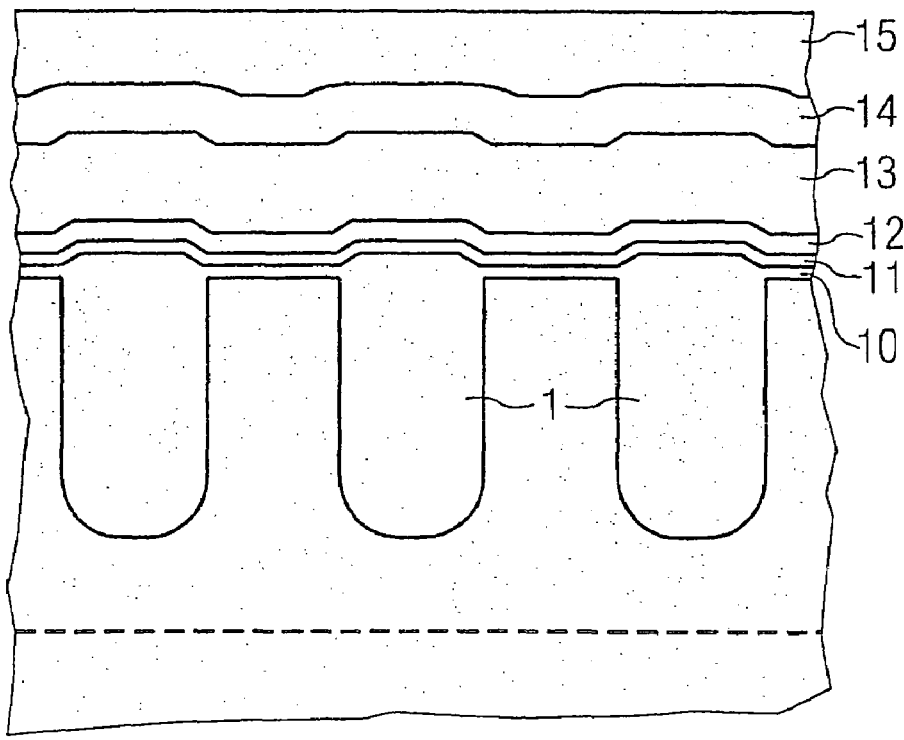
FIG. 5 shows the cross section of FIG. 4 after further steps of the fabrication method.

FIG. 5 shows the cross section in accordance with FIG. 4 after further steps of the fabrication method. A storage layer sequence is applied to the top side of the semiconductor body or substrate, which storage layer sequence is also provided as a gate dielectric and comprises a first boundary layer 10, a storage layer 11 and a second boundary layer 12. The boundary layers 10, 12 may be, in particular, an oxide, and the storage layer 11 a nitride. Instead of such an oxide-nitride-oxide layer sequence, a different storage layer sequence suitable for charge-trapping memory cells may be provided. These layers are initially applied over the whole area. They can be replaced wholly or partially by a different gate dielectric in the region of the periphery.

Next there follows a first word line layer 13, which is preferably polysilicon. A second word line layer 14 or word line layer sequence may be applied, which is, e.g., W/WN or WSi and improves the conductivity of the first word line layer 13. This is additionally followed by a hard mask layer 15 made of electrically insulating material. The hard mask is patterned in strip form in order thus to be able to pattern the word line webs (word line stacks) parallel at a distance from one another as can be seen in FIG. 6.

Figure 6:
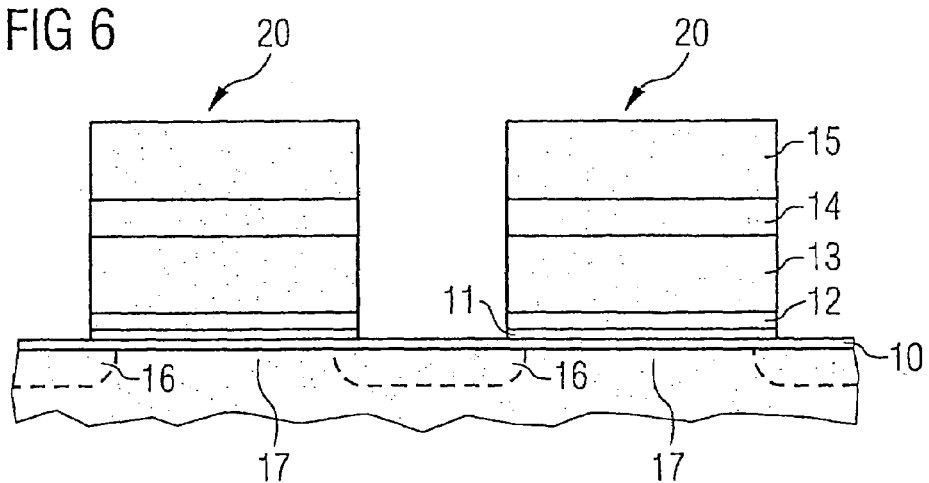
FIGS. 6 to 8 show details from intermediate products after different steps of the fabrication method in cross sections perpendicular to the word lines.

FIG. 6 illustrates the structure of the relevant intermediate product in a cross section transversely with respect to the word line webs 20. In this example, the word line webs 20 comprise the storage layer 11, the second boundary layer 12, the first word line layer 13 (e.g., polysilicon), the second word line layer 14 (e.g., WSi) and the hard mask 15. Between the word lines the actual storage layer 11 may be removed, as illustrated in FIG. 6. Alternatively, the second boundary layer 12 and the storage layer 11 may also still be present there. It is now possible to introduce the implants for the source/drain regions including the associated optimizations. If the second word line layer 14 is WSi, oxide layers, which may typically have a thickness of about 3 nm, are preferably formed at the sides of the word lines.

In subsequent lithography steps, LDD implantations (lightly doped drain) and pocket implantations may be effected in a manner known per se. The doped regions 16 depicted by broken lines in FIG. 6 are thus fabricated, which initially still have a lower dopant concentration than is envisaged for the finished source/drain regions. Situated between the doped regions 16 there is in each case a channel region 17 for the transistor.

Figure 7:
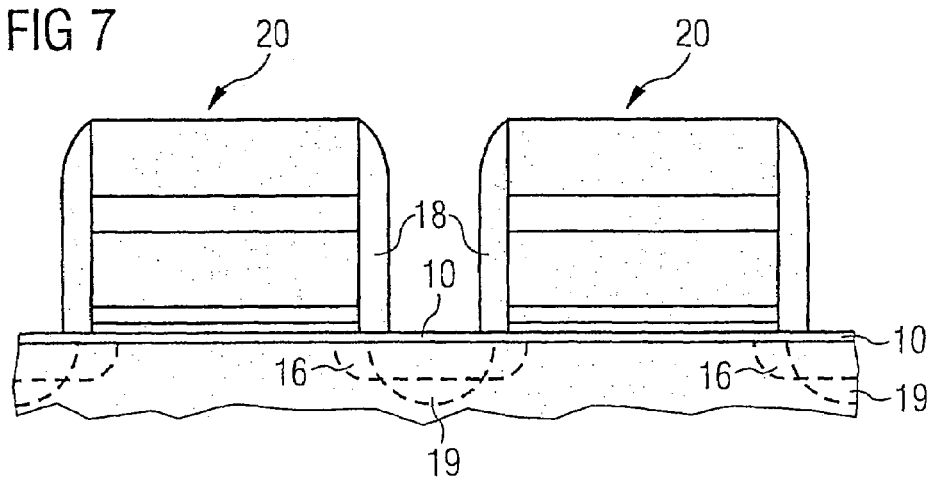

In accordance with the cross section of FIG. 7, spacers 18 are then fabricated at the side walls of the word line webs 20, the electrically conductive material of the word line webs 20 (in this example the first word line layer 13 and the second word line layer 14) also being electrically insulated laterally by means of the spacers. The spacers are fabricated in the customary manner by conformal deposition of the material provided therefor and subsequent anisotropic etching-back. The spacers 18 are used to mask a further implantation for forming the source/drain regions 19. The spacers 18 may already correspond to the spacers 3 depicted in FIGS. 1 to 3; however, it is also possible to fabricate further spacers before or after the implantation, as required. The implants are annealed.

Figure 8:
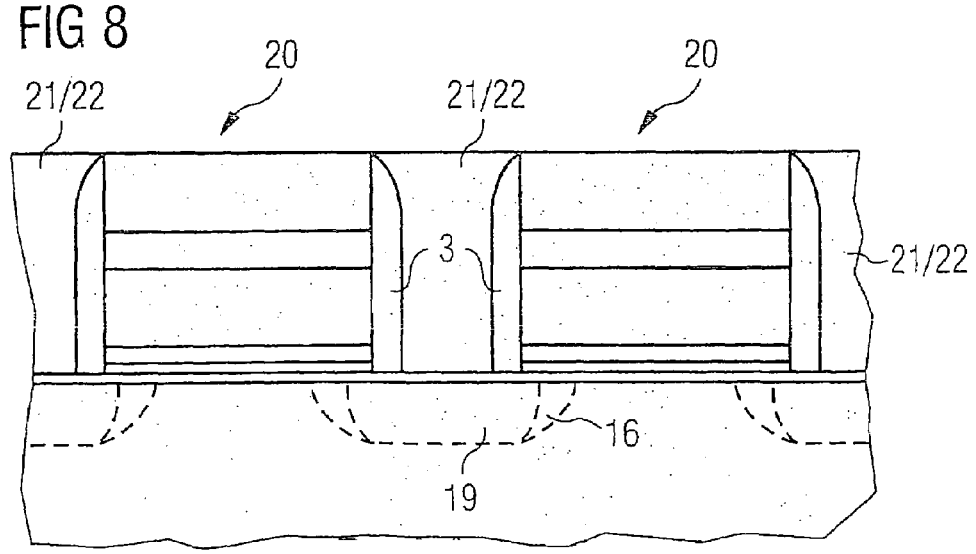

The cross-connections are fabricated in a subsequent step. As can be seen in FIG. 8, the cross-connections 21 and the dielectric fillings 22 that are in each case to be introduced in between are arranged in the interspaces between the word lines. Since the cross-connections are intended always to connect in each case a source/drain region to a subsequent source/drain region in the relevant interspace between the word line webs 20, but the cross-connections must be electrically insulated from one another, they must be formed in sections and be insulated from one another by dielectric material.

For this purpose, either first of all the interspaces are filled with dielectric material that is subsequently removed in the regions provided for the cross-connections (the electrically conductive material provided for the cross-connections is then introduced there) or, instead of this, the interspaces between the word line webs are first of all filled completely with the electrically conductive material provided for the cross-connections, which material is then removed in each case at the interval of the sections provided for the cross-connections and is replaced by dielectric material.

An appropriate dielectric material for the first variant is preferably the dielectric that is used for wide spacers, e.g., for the high-voltage transistors of the driving periphery. That may be, e.g., an oxide fabricated as TEOS (tetraethyl orthosilicate). In this case, it is advantageous if the spacers 18 are, e.g., nitride or a different material with respect to which the filled-in oxide can be selectively removed. The filled-in dielectric material is then removed in the regions provided for the cross-connections, so that only the dielectric fillings 22 remain. The material of the first boundary layer 10 is also removed in the openings thus fabricated, so that the doped semiconductor material of the source/drain regions 19 is uncovered there. An electrically conductive material, preferably polysilicon, can then be introduced into the openings, the source/drain regions 19 being contact-connected on the top side by means of the material. The top side is planarized.

In the case of the second variant mentioned, first of all the material of the first boundary layer 10 is removed, so that, in this exemplary embodiment, too, it is possible to fabricate an electrical contact between the material of the cross-connections and the top side of the source/drain regions 19. The interspaces between the word line webs 20 are then filled completely with the material, e.g., polysilicon, provided for the cross-connections. The top side is planarized. The introduced material is removed at the envisaged intervals by means of lithography, so that the individual sections provided for the cross-connections are isolated from one another. Dielectric fillings 22 can then be introduced in between, after which the top side is planarized again.

Figure 9:
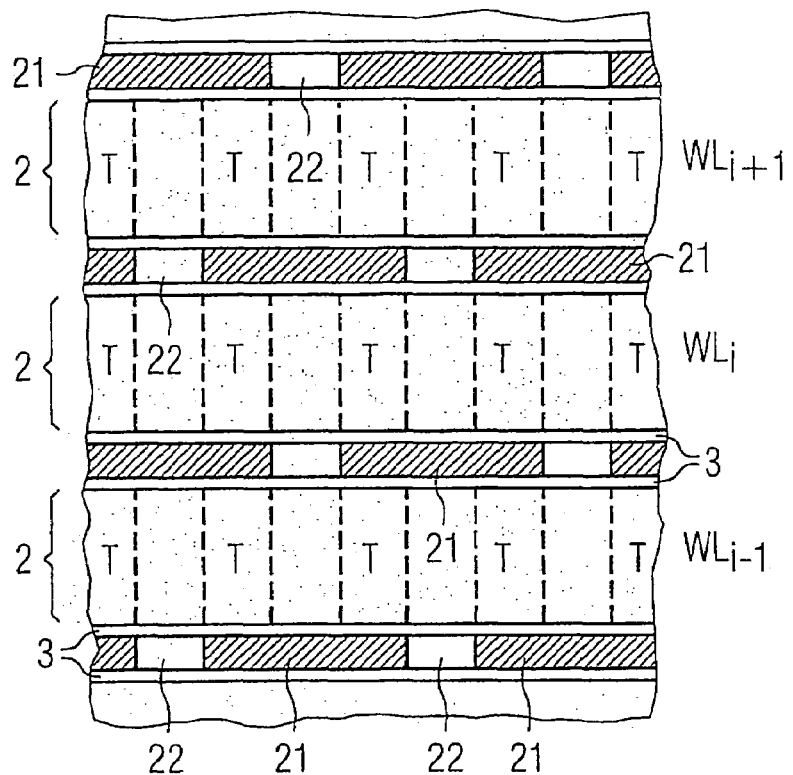
FIG. 9 shows the arrangement scheme of the transistors and word lines in a plan view.

FIG. 9 shows the structure thus obtained in a plan view. The orientation of this plan view corresponds to that of FIGS. 1 to 3. Three word lines $WL_{i-1}$, $WL_i$ and $WL_{i+1}$ running from left to right are depicted here. The memory transistors T are illustrated with their channel regions depicted by broken lines. A filled trench of the STI isolations 1 in each case runs between the channel regions. The cross-connections 21 are again depicted in hatched fashion here. The dielectric fillings 22 in each case isolate the sections of the electrically conductive material of the cross-connections 21 of the same word line interspace from one another.

Figure 10:
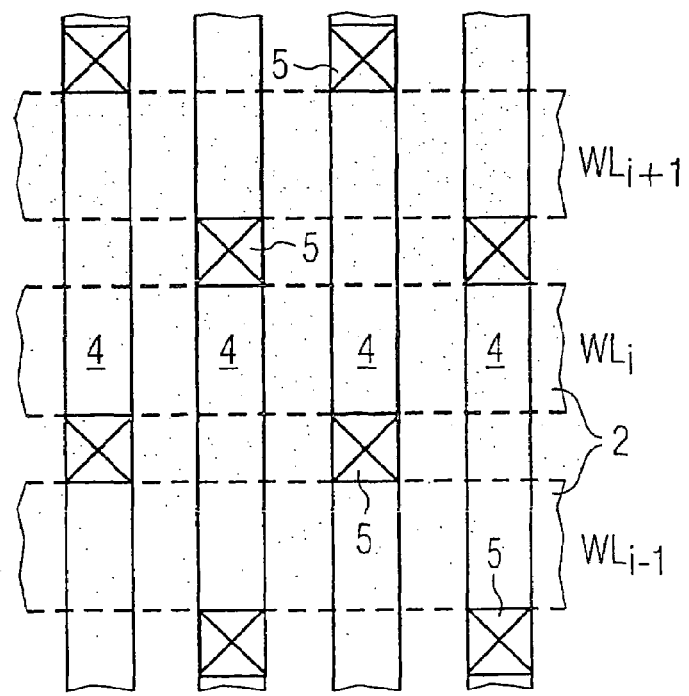
FIG. 10 shows the arrangement scheme of the word lines, bit lines and bit line contacts in a plan view.

FIG. 10 shows a simplified scheme of the plan view of FIG. 9 for elucidating the arrangement of the subsequently fabricated bit lines 4. These bit lines are arranged parallel at a distance from one another transversely with respect to the word lines and between the regions occupied by the memory transistors. Therefore, they run approximately above the trenches of the STI isolations 1. For orientation purposes, the numberings of the word lines 2 are likewise depicted in FIG. 10 in comparison with FIG. 9. FIG. 10 illustrates the positions of the bit line contacts 5 by which the bit lines 4, which are electrically insulated from the word lines 2, are electrically conductively connected to the respectively associated cross-connections 21.

Figure 11:
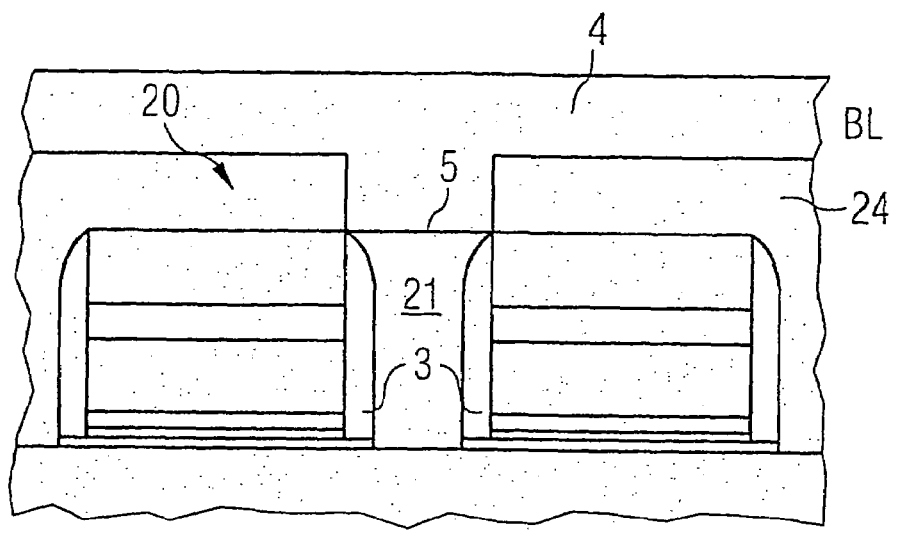
FIGS. 11 and 12 show further details from intermediate products after further steps of the fabrication method in cross sections transversely with respect to the word lines.

FIG. 11 illustrates a cross section transversely with respect to the word lines after the fabrication of the bit lines 4. A method that is known per se as "dual damascene scheme" is employed in the exemplary embodiment illustrated here. In this case, a layer 24 made of dielectric material is applied and provided with trenches in the regions of the envisaged bit lines and also with contact holes above the material to be contact-connected at the locations of the bit line contacts 5 to be fabricated. The contact holes are filled together with the trenches with a material provided for the bit lines, thereby producing the structure illustrated in cross section in FIG. 11.

In this semiconductor memory, the word lines have a higher electrical conductivity than in customary semiconductor memories having word lines with a smaller cross section. Nevertheless, the conductivity of the word lines can additionally be improved since it is particularly simple, in the case of the semiconductor memory according to the invention, to provide additional interconnects as word line straps. This is because the word lines 2 are formed wider since the longitudinal direction of the channel regions runs transversely with respect to the word lines. Therefore, the top side of the word lines can be contact-connected between the bit lines, so that, above the bit lines and electrically insulated from the latter, word line straps can be arranged parallel to the word lines. To that end, all known methods for fabricating metallizations can be employed, in principle. It is possible to use, e.g., an aluminium layer as base metal layer in conjunction with contact hole fillings made of tungsten. A further dual damascene technique using copper or tungsten may also be used.

Figure 12:
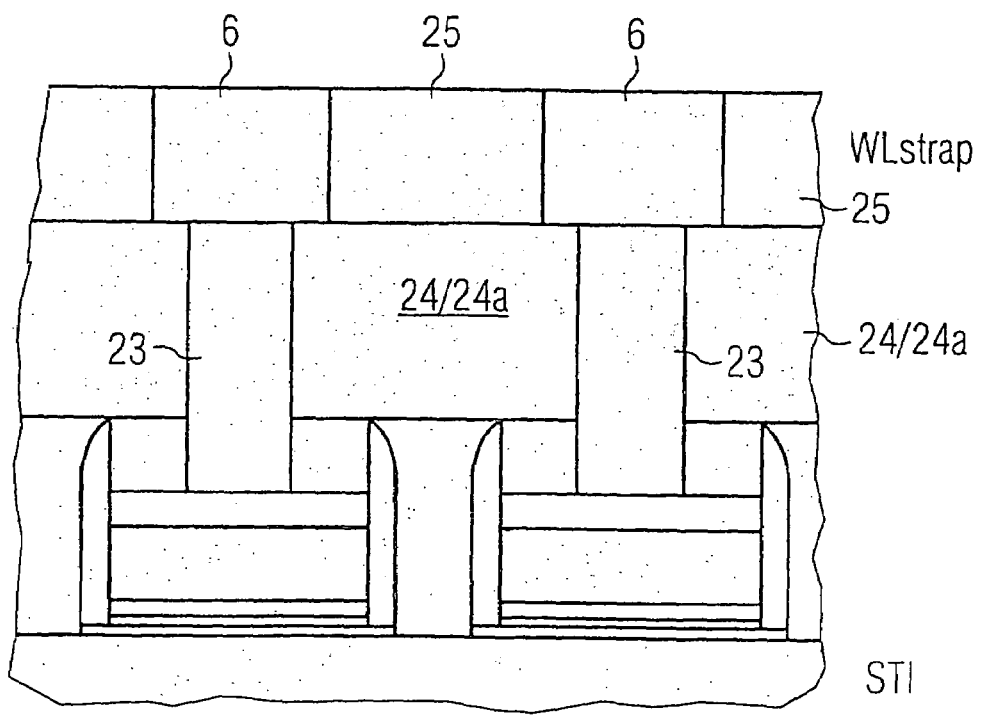

FIG. 12 shows the cross section after the fabrication of the word line straps 6 transversely with respect to the word lines and between two bit lines, in other words shifted in front of or behind the plane of the drawing relative to the cross section of FIG. 11. The interspaces between the bit lines fabricated and the top side of the bit lines are first of all covered with a further dielectric layer 24*a* and levelled. Contact holes are fabricated in the further dielectric layer 24*a*, which contact holes are filled with contact hole fillings 23 in accordance with the cross section of FIG. 12. The word line straps 6 are electrically conductively connected to these contact hole fillings 23. A further dielectric layer 25 is applied between the word line straps 6. Further method steps for completing the semiconductor memory may follow in a manner known per se.

Figure 13:
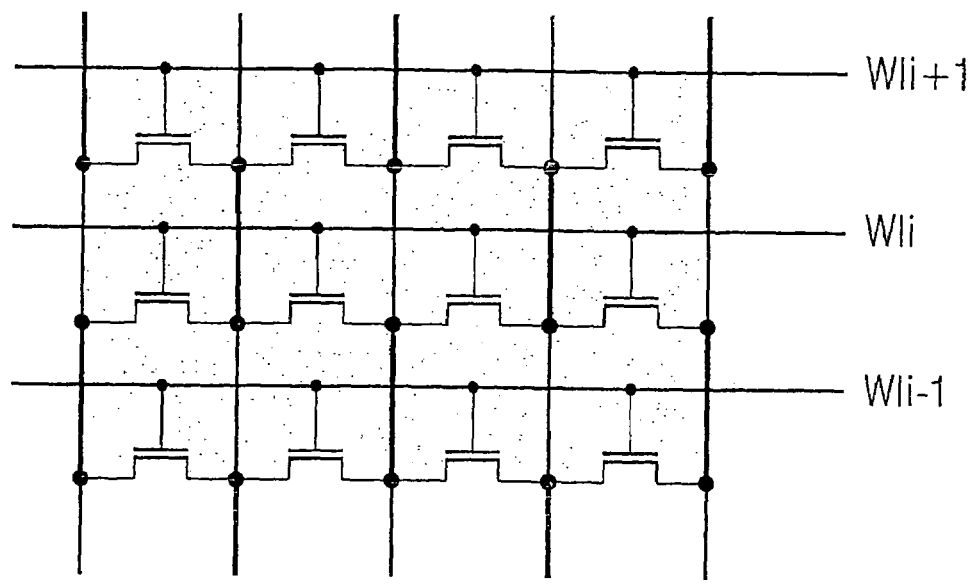
FIG. 13 shows the circuit scheme of the arrangement.

FIG. 13 shows a circuit scheme of a virtual ground memory cell architecture, in which the word lines are depicted running from left to right and the bit lines from top to bottom. The longitudinal direction of the transistors from source to drain in this case runs parallel to the word lines and thus corresponds to a previously customary arrangement of the transistors in the array. Although the semiconductor memory structure according to the invention has the same circuit scheme, the orientation of the transistors in the objective realization corresponds to a shortening of the connections that are depicted bolder in FIG. 13, so that the terminal points that are respectively connected to one another there coincide. The longitudinal directions of the transistors are thus as it were drawn parallel to the bit lines.

Figure 14:
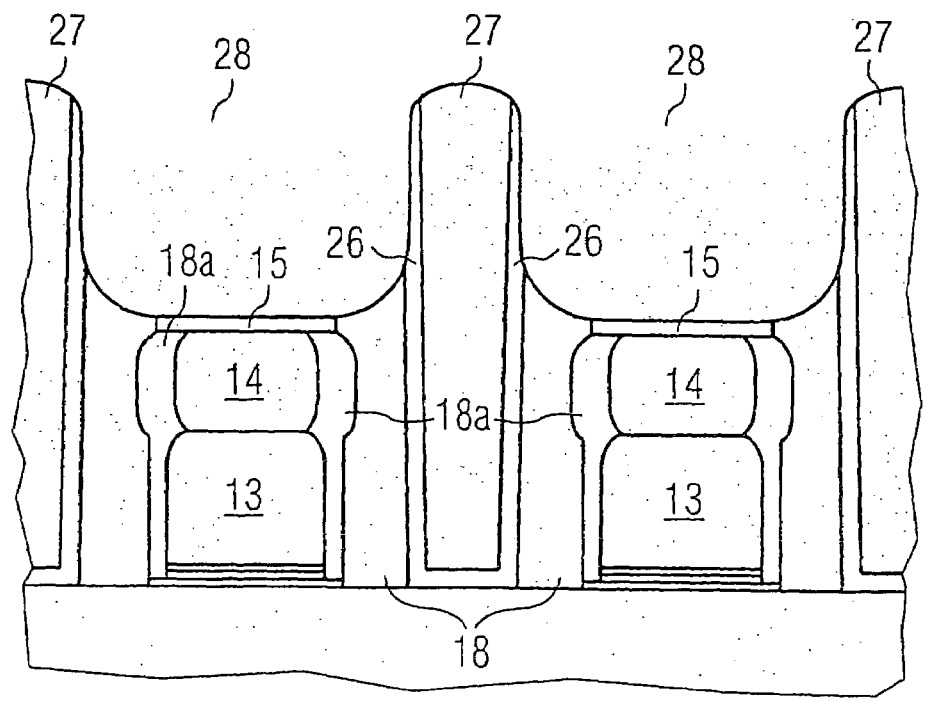
FIG. 14 shows a cross section corresponding to the cross section of FIG. 7 for an alternative exemplary embodiment.

In a particularly preferred configuration, the word line webs 20 are provided laterally with spacers 3 made of oxide. To that end, a method is suitable, in particular, in which, in accordance with FIG. 14, which corresponds to the cross section of FIG. 7, the word line layers 13, 14 are oxidized laterally to form oxide layers 18*a*, which encapsulate the word lines, and the spacers 18 made of oxide are then fabricated. The hard mask 15 is provided beforehand in the thickness provided for the dimensions of the spacers and is fabricated from nitride. The spacers 18 are fabricated by whole-area conformal deposition of an oxide layer and subsequent anisotropic etching-back of the oxide. In accordance with a preferred embodiment of the method, the top side of the structure thus fabricated is coated with a thin nitride layer (nitride liner 26), as is depicted in FIG. 14.

Next, a filling 27 is introduced into the interspaces between the word lines, whereupon the top side is planarized. The filling 27 is a material that is provided for the dielectric filling 22 and can be etched selectively with respect to silicon nitride. BPSG, for example, can be used here. After the planarization of the surface, the hard mask 15 is at least partly removed, at the same time the openings 28 formed being widened towards the sides, as illustrated in FIG. 14. The nitride liner 26 serves as an etching stop layer in this case. The extended openings 28, which project laterally over the word line webs beyond the spacers 18, are filled with nitride layers. These nitride layers then serve as a mask for laterally delimiting the regions in which the filling 27 is removed and into which the material of the cross-connections 21 is introduced.

In this way, it is possible to fabricate non-volatile memory cell transistors as virtual ground arrays that are electrically insulated from one another by means of continuous isolation trenches. A high circuit density is achieved at the same time. The source/drain regions can be optimized by LDD and pocket implants. The electrical conductivity of the word lines can be increased by means of word line straps. The narrow width effect is avoided. The thermal budget during fabrication can be kept low, since the source/drain junctions are implanted after the fabrication of the gate dielectrics.

What is claimed is:

1. A memory array architecture comprising:
a substrate having a first polarity and including a plurality of shallow trench isolation areas arranged substantially continuously along a first direction;
a plurality of conductive word lines arranged along a second direction transverse to said first direction, said word lines being isolated from the substrate at least partially by a trapping dielectric, wherein regions of said substrate between adjacent word lines are implanted with an impurity having a second polarity, thereby producing a plurality of source/drain regions bounded by said trench isolations in said second direction, said source/drain regions being arranged in alternating odd and even numbered columns along said first direction and in alternating odd and even numbered rows along said second direction;
a plurality of conductive jumper connections substantially above said trench isolation areas electrically connecting pairs of said source/drain regions, each pair of source/drain regions in an even-numbered row connecting a source/drain region in an even-numbered column and an adjacent source/drain region in a subsequent odd-numbered column, and each pair of source/drain regions in an odd-numbered row connecting a source/drain region in an odd-numbered column and an adjacent source/drain region in a subsequent even-numbered column; and
a plurality of conductive bit lines arranged along said first direction above said jumper connections, each of said bit lines connecting a plurality of jumper connections in either even-numbered or odd-numbered of said rows.

2. The memory array architecture of claim 1, wherein the source/drain regions are arranged laterally adjacent to the word lines.

3. The memory array architecture of claim 1, wherein:
the word lines are provided with lateral spacers;
the conductive jumper connections are arranged adjacent to the spacers and electrically insulated from the word lines by the spacers;
dielectric fillings are provided between the conductive jumper connections, and a layer of dielectric material is provided above the word lines and the conductive jumper connections;
the bit lines are arranged within the layer of dielectric material; and
bit line contacts are arranged on the conductive jumper connections and coupled to the bit lines by filled contact holes being provided in the layer of dielectric material.

4. The memory array architecture of claim 1, wherein said word lines are substantially completely isolated from the substrate by said trapping dielectric layer.

5. The memory array architecture of claim 1, wherein said memory array is adapted to be operated as a virtual ground array.

6. The memory array architecture of claim 1, wherein said bit lines comprise metal bit lines.

7. The memory array architecture of claim 1, wherein said memory array is an NROM memory array.

8. The memory array architecture of claim 1, wherein said trapping dielectric comprises a storage layer between two boundary layers.

9. The memory array architecture of claim 8, wherein said storage layer comprises a nitride layer and wherein said boundary layers comprise oxide layers.

10. The memory array architecture of claim 1, wherein said memory array is a floating gate memory array.

11. The memory array architecture of claim 1, wherein the conductive jumper connections are formed of an electrically conductive material other than polysilicon.

12. A method for fabricating a semiconductor memory, the method comprising:
  doping a top side of a semiconductor body to form channel regions of memory transistors;
  forming strip-type STI isolations in the semiconductor body parallel and at a distance from one another;
  forming a dielectric storage layer sequence comprising a first boundary layer, a storage layer and a second boundary layer;
  forming word lines over the semiconductor body by patterning electrically conductive material and electrical isolations on the top side, the word lines running parallel at a distance from one another transversely with respect to the STI isolations;
  forming source/drain regions by introducing dopant between the STI isolations and the word lines;
  forming interconnects by introducing electrically conductive material and dielectric material into interspaces between the word lines, the electrically conductive material being patterned in such a way that, in accordance with a consecutive numbering of the source/drain regions along a respective word line, in the case of which the source/drain regions that are not arranged on different sides of an STI isolation each acquire the same number:
  on one side of the word line, in each case an even-numbered source/drain region is electrically conductively coupled to the subsequent odd-numbered source/drain region in the numbering, and
  on the opposite side of this word line in each case an odd-numbered source/drain region is electrically conductively connected to the subsequent even-numbered source/drain region in the said numbering, and
  forming bit lines by applying electrically conductive material in strip form and arranged parallel at a distance from one another and transversely with respect to the word lines, the bit lines being contact-connected with the electrically conductive material in the interspaces between the word lines in such a way that a respective bit line is electrically conductively connected to the portions of the electrically conductive material that are present successively along the bit line in each case in next but one interspaces between the word lines.

13. The method according to claim 12, further comprising forming spacers at side walls of the word lines, wherein the spacers are used to mask an implantation forming the source/drain regions.

14. The method according to claim 13, wherein the electrically conductive material introduced into the interspaces between the word lines is structured in such a way that it does not extend above the spacers.

15. The method according to claim 12, wherein forming a dielectric storage layer sequence comprises forming an oxide layer as the first boundary layer, forming a nitride layer as the storage layer, and forming an oxide layer as the second boundary layer.

16. The method according to claim 12, further comprising:
  planarizing a top side between the bit lines;
  forming contact holes that uncover the electrically conductive material of the word lines; and
  forming word line straps as interconnects that are electrically conductively connected to a relevant word line via contact hole fillings and are electrically insulated from the bit lines.

17. The method according to claim 12, wherein forming bit lines comprises:
  forming a layer of dielectric material;
  forming contact holes within the dielectric material above the material to be contact-connected and forming trenches in the regions where the bit lines are formed; and
  filling the contact holes and the trenches with the electrically conductive material.

18. The method according to claim 12, further comprising:
  forming oxide spacers at side walls of the word lines;
  covering the spacers with a nitride liner; and
  applying a nitride layer that projects laterally over the word line, the nitride layer being applied above the word lines and the spacers;
  wherein forming interconnects comprises:
  providing interspaces present between the word lines with a dielectric filling;
  using a mask having openings in the regions provided for electrically conductive material to selectively remove the dielectric filling with respect to the nitride layer and the nitride liner in the regions; and
  introducing the electrically conductive material into the openings.

19. The method according to claim 12, wherein the semiconductor body comprises a semiconductor substrate.

20. A method for fabricating a semiconductor memory, wherein
  in a first step, at a top side of a semiconductor body or substrate, in an arbitrary order, a concentration of dopant that suffices for forming channel regions of memory transistors is provided and strip-type STI isolations arranged parallel at a distance from one another are fabricated;
  in a second step, a dielectric storage layer sequence comprising a first boundary layer, a storage layer and a second boundary layer is applied;
  in a third step, electrically conductive material is applied and patterned together with electrical isolations on the top side to form word lines, which run parallel at a distance from one another transversely with respect to the STI isolations;

in a fourth step, the word lines are electrically insulated laterally and source/drain regions are fabricated by introducing dopant between the STI isolations and the word lines;

in a fifth step, electrically conductive material and dielectric material are introduced into interspaces between the word lines and patterned in such a way that, in accordance with a consecutive numbering of the source/drain regions along a respective word line, in the case of which the source/drain regions which are not arranged on different sides of an STI isolation each acquire the same number, a) on one side of the word line, in each case an even-numbered source/drain region is electrically conductively connected to the subsequent odd-numbered source/drain region in the said numbering, and b) on the opposite side of this word line, in each case an odd-numbered source/drain region is electrically conductively connected to the subsequent even-numbered source/drain region in the said numbering; and in a sixth step, electrically conductive material is applied in strip form for the purpose of forming bit lines which are arranged parallel at a distance from one another and transversely with respect to the word lines and is contact-connected with the electrically conductive material introduced in the fifth step in such a way that a respective bit line is electrically conductively connected to the portions of the said electrically conductive material which are present successively along the bit line in each case in next but one interspaces between the word lines.

\* \* \* \* \*